United States Patent [19]
Jackson et al.

[11] Patent Number: 5,567,971
[45] Date of Patent: Oct. 22, 1996

[54] VARIABLE SIZE LIGHT SENSOR ELEMENT

[75] Inventors: Warren B. Jackson, San Francisco; David K. Biegelsen, Portola Valley, both of Calif.

[73] Assignee: Xerox Corporation, Stamford, Conn.

[21] Appl. No.: 479,874

[22] Filed: Jun. 7, 1995

[51] Int. Cl.⁶ ................................................. H01L 27/14
[52] U.S. Cl. ............................ 257/431; 257/53; 257/444
[58] Field of Search .................................. 257/431, 443, 257/444, 461, 462, 53

*Primary Examiner*—Mark V. Prenty
*Attorney, Agent, or Firm*—Robert A. Burtzlaff

[57] ABSTRACT

A sensor array includes includes multiple sensor elements that each have a collection electrode in contact with a photosensitive layer. The photosensitive layer is configured to produce a detectable response at the collection electrode upon incidence of radiation in a responsive zone of the photosensitive layer. A gate electrode layer is separated from the photosensitive layer by a dielectric layer, with adjustments to voltage applied to the gate electrode layer inducing changes in areal extent of the responsive zone of the photosensitive layer. Changing the size of the responsive zone permits performance of image convolutions for edge detection, data compression, or other Gaussian convolutions by the sensor array, rather than by post-detection electronics.

11 Claims, 8 Drawing Sheets

VARIABLE SIZE LIGHT SENSOR ELEMENT

FIELD OF THE INVENTION

This invention relates to a sensor element for detection of incident light or other radiation. More particularly, this invention relates to sensor elements capable of being grouped into imaging arrays, with each sensor element responding to radiation in a detection zone that can be varied in size.

BACKGROUND AND SUMMARY OF THE INVENTION

Most conventional image sensors operate by sensing an image projected onto an array of discrete image sensor elements. The electrical response of each image sensor element is proportional to the total light falling within its boundaries. The electrical pattern held by the array of discrete image sensor elements is retrieved by sequentially interrogating the electrical response of each of the sensor elements. The resulting sensor output is converted into digital representations (e.g., numbers ranging from 0–255, or any other convenient range) of the impinging light intensity. These numbers can be used to directly construct a video or print image (with the relative intensity of the sensor output of each image sensor element being reproduced as a single picture element or "pixel"), or alternatively can be modified using conventional image processing algorithms to provide edge enhancement, half-tone descreening, image compression, noise reduction, or other known image enhancement techniques. For example, one commonly employed image processing technique requires that those numbers corresponding to adjacent or nearby sensor elements in the array of image sensor elements be combined in a weighted average. This technique is equivalent to convolution with a kernel of weight coefficients. Often these weighting factors are Gaussian functions of distance from the center of the kernel. Many image processing functions such as edge detection, Gaussian pyramid compression, and edge enhancement have been implemented using Gaussian kernels.

Unfortunately, Gaussian image processing kernels often extend over a large number of neighboring pixels. Consequently, if the kernel possesses N elements and the image consists of M pixels, evaluation of just one convolution of the image with a Gaussian kernel nominally requires N×M multiplications and additions (note that symmetries in the Gaussian kernel may reduce somewhat the required number of calculations). Given a common scanning resolution of 300 dots per inch, a typical number of pixels for a page sized image is on the order of M=10 million pixels. Even a single 5×5 average of neighboring pixels would require about 250 million multiplications and additions. Such a computational task can require several seconds or longer per convolution, even on high performance massively parallel processors. The necessity for speed is particularly critical in real-time applications, applications requiring a varying kernel size, or applications requiring user feedback.

One possible technique for high speed convolution relies on varying sensor size, since a measured electrical output of a sensor array is inherently a convolution between image intensity and spatial dependence of sensor response. If the spatial response (sensor size) of the detector is adjusted to match a desired kernel, the requisite convolutions with that kernel are implicitly computed with a speed comparable to the sensor array readout time. In effect, by adjusting the size of the sensor, one can perform a desired convolution at the same speed as the image is stored, without requiring any additional computer processing time.

However, conventional sensor fabrication techniques do not allow for externally controlled, real time variations in the size of light sensitive areas of individual sensor elements. In conventional sensor arrays (usually composed of Schottky, p-n, or p-i-n sensor elements), the light sensitive areas of the individual sensor elements are designed to be discrete, fixed size and non-overlapping with neighboring sensor elements. The light falling within one pixel induces an electrical response in only that corresponding element. Typically, the radiation sensitive zone or area is defined by physically patterning the active region of each sensor element. Accordingly, the shape, size, or position of the light sensitive active region of a sensor cannot be altered after fabrication. The fixed binary response of patterned sensors is thus inappropriate for many image processing convolution tasks.

Accordingly, the present invention relates to radiation sensor elements with radiation responsive areas that can be spatially altered by external control. Since the size of the responsive area can be altered, response to incident radiation is not limited to a predetermined area, but can be varied as desired. It is even possible that the responsive area of a radiation sensor element can be extended to overlap the responsive area of a neighboring element. The invention also is capable of permitting implementation on the radiation sensor of convolutions with certain classes of useful image kernels. In a preferred embodiment, a radiation sensor in accordance with the present invention includes a semiconductor device having a collection electrode and a radiation sensor positioned in electrical contact with the collection electrode. The radiation sensor is configured to produce a detectable response at the collection electrode upon incidence of radiation (e.g., X-rays, ultraviolet, visible, infrared, or other detectable radiation) in a responsive zone. A gate electrode layer is separated from the radiation sensor by a dielectric layer, with adjustments to voltage applied to the gate electrode inducing changes in areal extent of the responsive zone of the radiation sensor.

In a most preferred embodiment, the radiation sensor is a p-i-n or n-i-p type sensor having a collection electrode for collecting charge generated by radiation incident on the i-layer (typically intrinsic amorphous silicon). To simplify retrieval of data, a pass transistor can be connected to receive charge from the collection electrode for user controlled passing of charge to a data line. Preferably, the pass transistor has a drain connected to the collection electrode, a source connected to the data line and separated from the drain, and a pass transistor gate electrode that can be activated to promote passage of charge from the drain to the source, and ultimately to a data line for measurement.

In another alternative embodiment of the present invention having particularly high sensitivity, the collection electrode is configured to act as a pass transistor gate electrode. The pass transistor gate electrode is layered in electrical contact with radiation sensor. Depending upon the amount of received photogenerated charge by the radiation sensor, the pass transistor gate electrode controls the amount of current passing between a drain and a source layered above the pass transistor gate electrode. This change in current flow between the source and the drain is provided to a data line as a measure of the magnitude of the photogenerated charge.

Other objects and advantages of the present invention will become apparent to those skilled in the art upon consider-

DETAILED DESCRIPTION OF THE INVENTION

Figure 1:
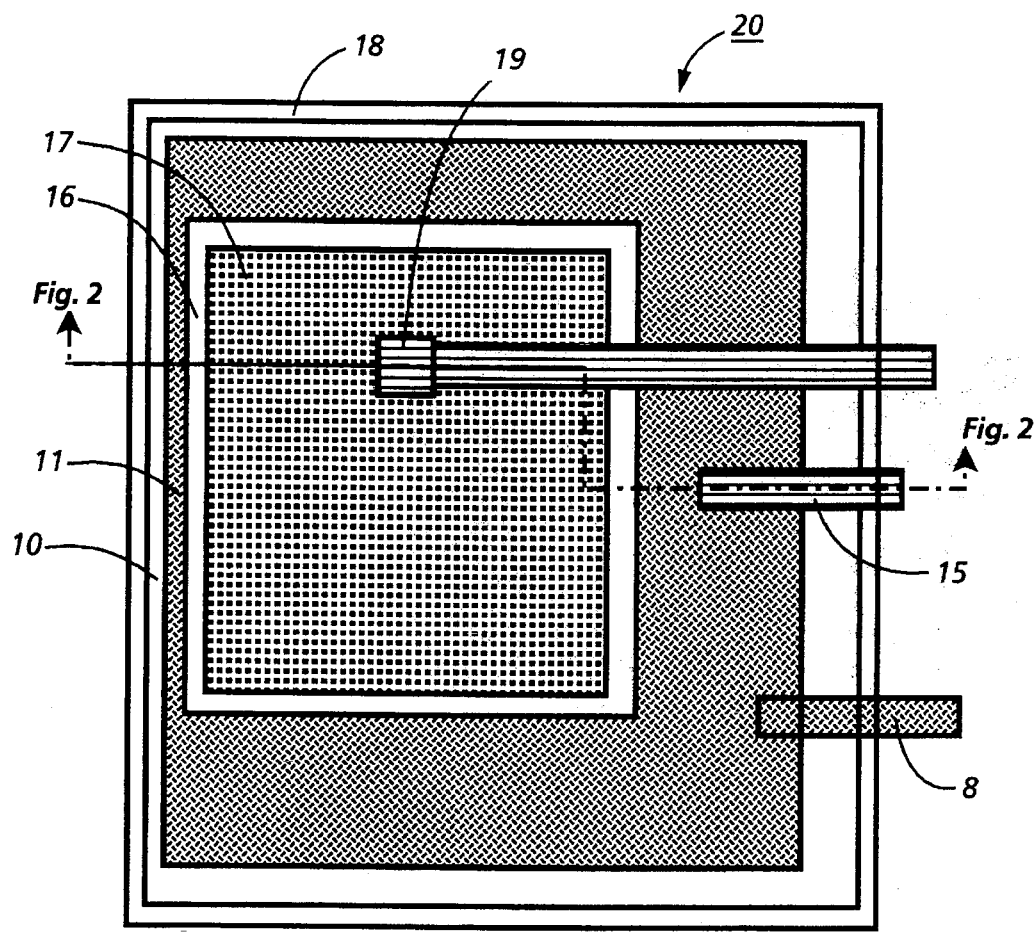
FIG. 1 presents a plan view of a single radiation sensor element in accordance with the present invention, showing an intrinsic amorphous silicon layer for detecting light positioned over a gate electrode that can be voltage biased to control the light responsive area of the sensor element.
Figure 2:
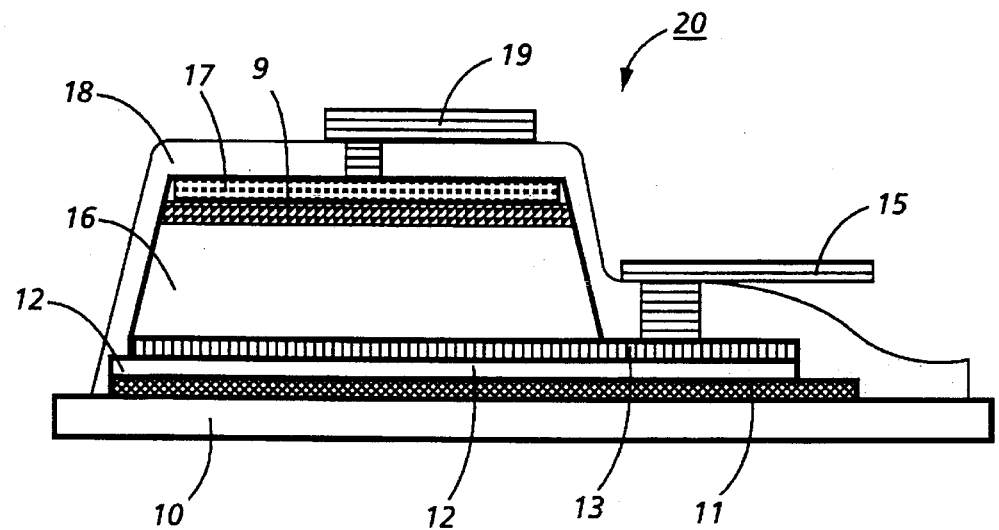
FIG. 2 is a cross sectional view taken substantially along line 2—2 of FIG. 1.

As illustrated with reference to FIGS. 1 and 2, the present invention provides a radiation sensor element 20 for sensing incident radiation in a variable size detection zone. In contrast to conventional fixed responsive area detectors such as charge coupled devices (CCD's), the detection zone of sensor element 20 can vary in size under electronic control. For example, the responsive area for detection of incident radiation in sensor element 20 can be varied to range from zero to 100%, as measured over the surface area of the sensor element 20. In certain embodiments of the present invention, the response to incident radiation can even be greater than 100%, with charge distributed among neighboring elements to provide overlapping detection zones. Among other applications, these sensors can be used to implement convolutions with certain classes of useful image kernels to allow a user to perform efficient and high speed edge detection, edge enhancement, or other useful image processing functions in parallel.

Construction of sensor element 20 begins with provision of a glass, silicon, or other suitable substrate 10 onto which a gate electrode 11 is deposited (Mo/Cr or other conventional conductors can be used for the gate electrode). The gate electrode is electrically connected to contact 8 constructed from aluminum or other conductive material. A dielectric layer 12 (typically silicon nitride or silicon dioxide) is deposited on top of the gate electrode 11, followed by deposition of an active layer 13 of polycrystalline silicon or amorphous silicon (possibly phosphorus doped). In the illustrated embodiment, the active layer 13 functionally provides an accumulation layer. Over most of this active layer 13, an intrinsic layer 16 of amorphous silicon is deposited, followed by deposition of a p-type layer 9 of p-type amorphous silicon (e.g., boron doped). Since the layer 9 is a p-type layer, the combination of layer 9, intrinsic layer 16, and active layer 13 together form a p-i-n detector with a radiation sensitive region that allows for creation of holes and electrons in the intrinsic layer 16 in response to impinging radiation, including ultraviolet, visible, infrared light, or other energetic radiation. To permit transmission of radiation to the intrinsic layer 16 while enhancing the physical protection of the sensor element 20, the boron-doped p-type layer 9 is optionally topped with a transparent contact 17 (e.g., indium tin oxide), and covered with a transparent passivation layer 18 fabricated from a suitable dielectric layer such as silicon oxynitride for protection.

To provide electrical contact with the transparent contact 17, a via is cut through the passivation layer 18. A top electrode 19 (generally fashioned from aluminum or other conductive material) is deposited in the via to ensure electrical contact with the transparent contact 17, and the underlying layers 9, 16, and 13. In addition, a via is cut adjacent to active layer 13 and a collection electrode 15 (often fabricated from n+amorphous silicon, aluminum, or other suitable conductive material) is deposited to form an ohmic contact with the active layer 13.

Figure 3:
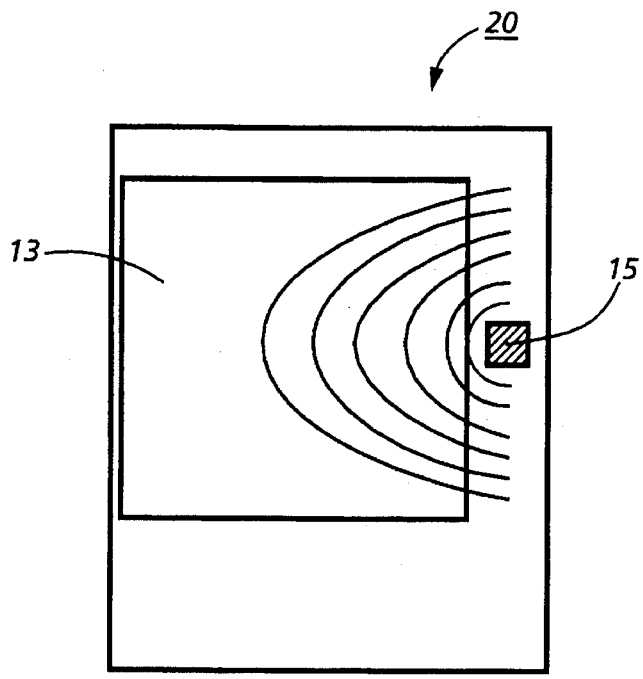
FIG. 3 is a schematic view of the single sensor element of FIGS. 1 and 2, qualitatively illustrating with isocurrent contour lines the spatial response of the collection electrode to light.
Figure 4:
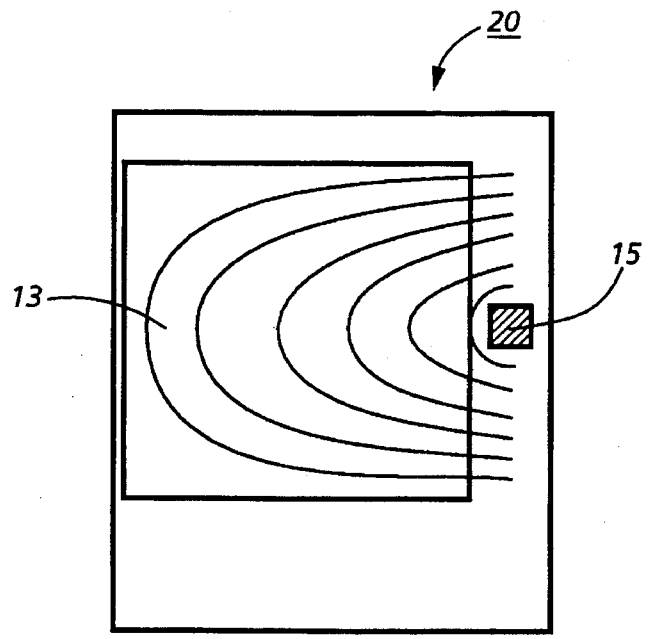
FIG. 4 is a schematic view of the single sensor element of FIGS. 1 and 2, qualitatively illustrating with isocurrent contour lines the spatial response of the collection electrode to light when either a large positive bias is applied to the gate electrode or given small termination conductances for the collection electrode.

In operation, a positive voltage is applied to the gate electrode 11 by contact 8 to induce an electric field in the active layer 13, changing its sheet resistance R. A negative voltage bias is concurrently applied to the top electrode 19, effectively creating a reverse biased p-i-n sensor from the consecutively arranged layers 9, 16, and 13. Illumination of the sensor element 20 with incident radiation causes the formation of electrons and holes in the intrinsic layer 16. These electrons and holes separate in the electric field between the gate electrode 11 and the transparent top contact 17 of the sensor 20, with the holes moving toward the p-type layer 9 while the electrons drift toward the active layer 13. The electron current flows through the active layer 13 to collection electrode 15, with the direction and number of electrons drifting to collection electrode 15 depending on the sheet resistance R of the intrinsic layer 16, the termination conductance G of the collection electrode 15, and the capacitance per unit area C of the sensor element 20. As an example of varying the detection zone of the sensor 20, consider operation of the sensor element 20 under illumination by a scanned continuous point source and a respective low and high voltage bias applied to the gate electrode 11. If the positive bias on gate electrode 11 is low, and the termination impedance is small compared with the sheet resistance R of the active layer 13, the contribution of photogenerated current flowing to the collection electrode 15 as a function of position of the point light source will exhibit isocurrent contour lines qualitatively as given in FIG. 3. If the sheet resistance R of the active layer 13 is decreased by increasing the positive bias to the gate electrode 11, and the termination conductance G held constant, the responsive area of the sensor element 20 will expand as depicted in FIG. 4.

The response function of the sensor element 20 varies with time as well as position. The generated voltage induced by the incident radiation spreads from the point of generation according to a Gaussian distribution function of width $(t/RC)^{1/2}$, where t is the time elapsed from generation, R is the lateral sheet resistance in the intrinsic layer 16 of the sensor element 20, and C is the capacitance per unit area of the sensor element 20. For short times the response function of the sensor element 20 is clustered around the collection electrode (similar to FIG. 3) while at later times, it increases to encompass more of the active area of the device such as shown in FIG. 4.

As those skilled in the art will appreciate, it is of course possible to reverse the order of the p-type layers and the n-type layers, forming a n-i-p sensor instead of the described p-i-n sensor. With appropriate changes to the bias, operation of such a reversed device would be similar to the previously described embodiment of the present invention.

Figure 5:
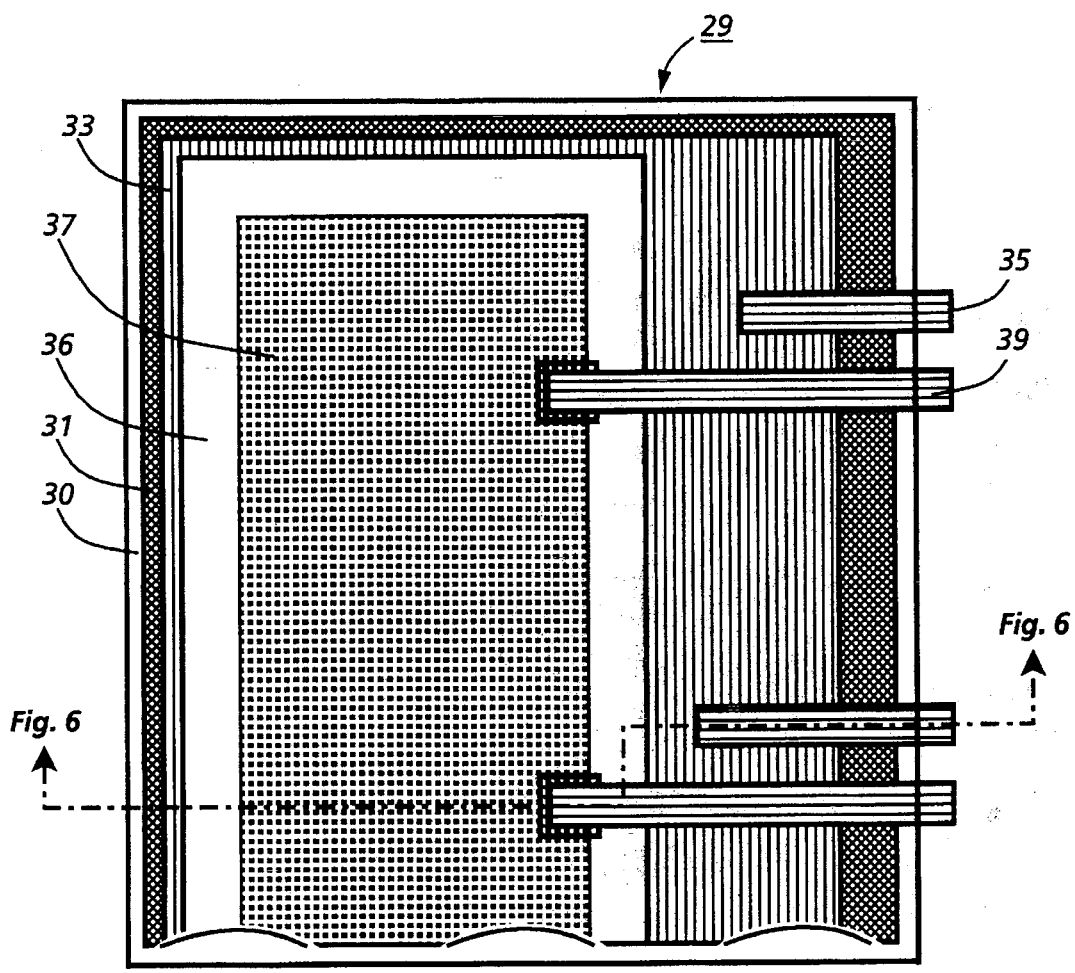
FIG. 5 presents a plan view of a portion of a sensor array with multiple radiation sensor elements in accordance with the present invention.
Figure 6:
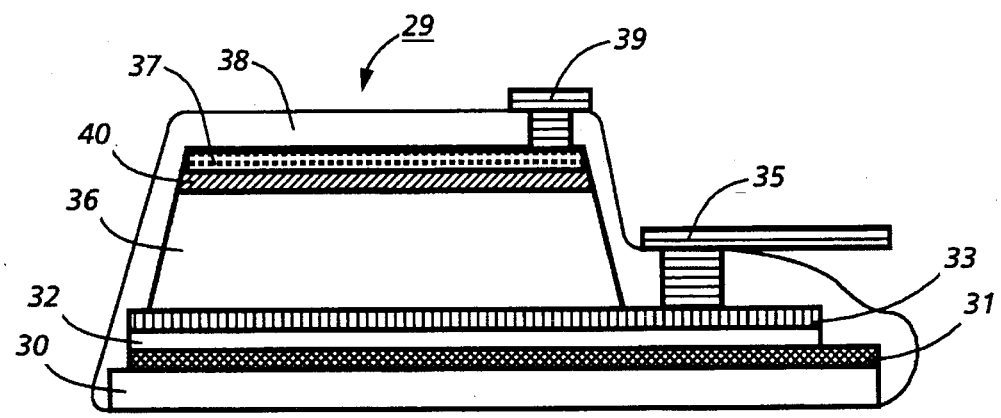
FIG. 6 is a cross sectional view along line 6—6 of Figure.

An embodiment of the present invention useful for imaging is illustrated in FIGS. 5 and 6. Composed of multiple sensor elements similar to that previously described in connection with. FIGS. 1 and 2, a sensor array 29 includes a plurality of sensor elements grouped into a linear array on a substrate 30. Fabrication and operation of sensor array 29 are as previously discussed in connection with FIGS. 1 and 2. A gate electrode 31 is fabricated on the substrate 30, and layered atop the gate electrode 31 is a dielectric layer 32. An active layer 33 (composed of n-type or intrinsic amorphous silicon or polycrystalline silicon) is deposited on top of dielectric layer 32. An intrinsic layer 36 is deposited over active layer 33 to form a region responsive to impinging radiation. The intrinsic layer 36 is respectively topped with a p-type layer 40 (typically boron doped amorphous silicon), a transparent contact 37, and a passivation layer 38 fabricated from a suitable dielectric material such as silicon oxynitride. To provide respective electrical contact to the transparent contact 37 and the active layer 33, vias are cut through the passivation layer 38. Top electrodes 39 are deposited in the top vias to provide electrical contact with the transparent contact 37 and the intrinsic layer 36. To provide for completion of an electrical circuit necessary to form a p-i-n detector, collection electrodes 35 are deposited in the lower vias to form an ohmic contact with the active layer 33.

Figure 7:
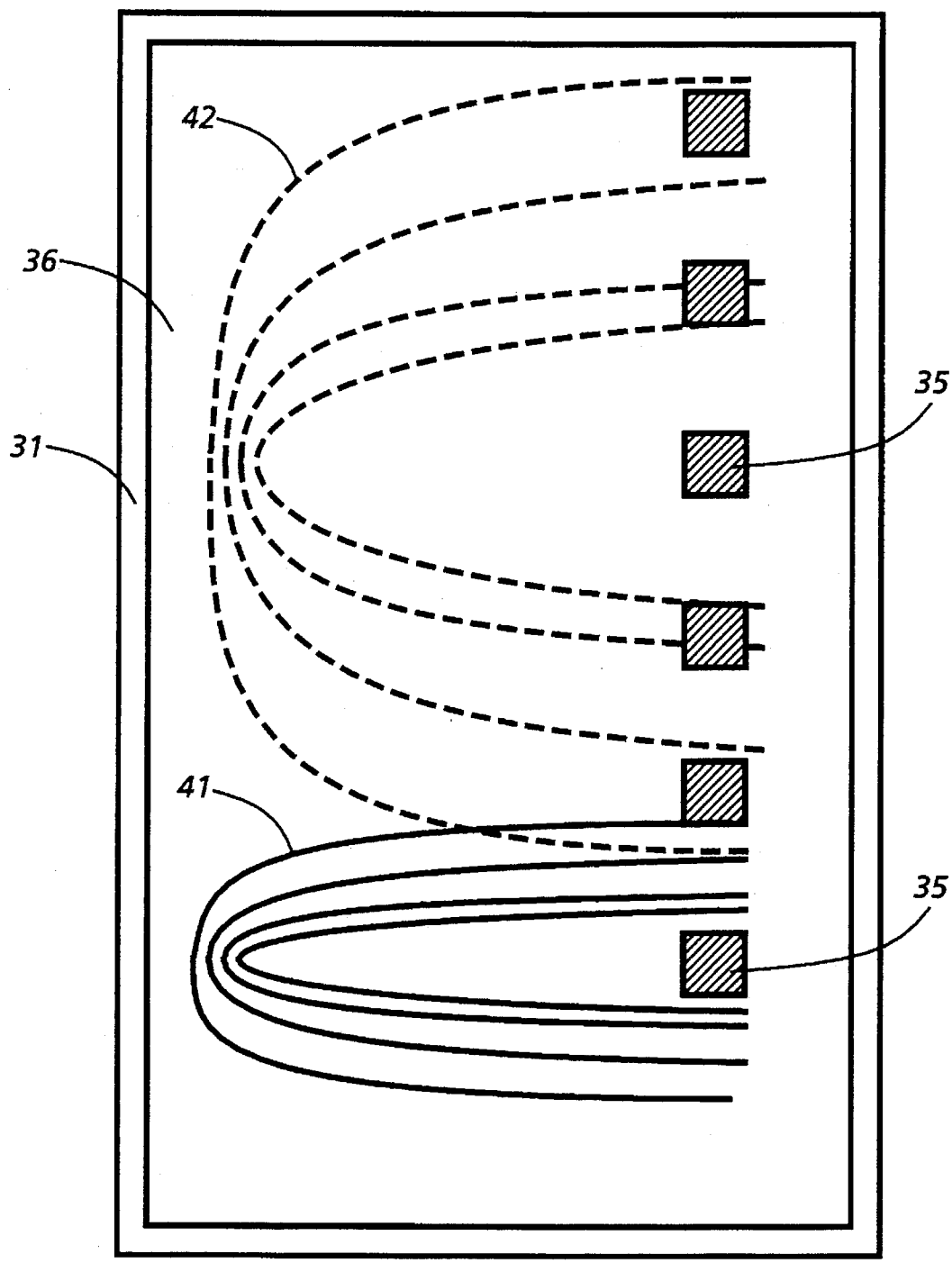
FIG. 7 is a schematic view of the sensor array of FIGS. 5 and 6, expanded to show six sensing centers serially arrayed.

The solid lines 41 in FIG. 7 qualitatively indicate the isocurrent response of a collection electrodes 35 as a function of position of a point source of illumination with small bias to the gate electrode 31, leading to a high lateral sheet resistance R in the active layer 33. In contrast, if the sheet resistance R, is decreased by increasing the positive bias to the gate electrode 31, and/or the collection electrode conductance G concomitantly decreased, the responsive area of each sensor element will expand. If desired, the sheet resistance R can be so decreased as to allow overlap between neighboring sensor elements of isocurrent contour lines, indicating charge sharing between those sensor elements for any illumination at this position. This is qualitatively indicated in FIG. 7 with dashed lines 42 centered about another collection electrode.

Advantageously, the ability to vary the zone of radiation detection sensitivity in accordance with present invention by varying the voltage bias to the gate electrode 31 permits substantial speed improvements in certain image processing algorithms. Sensing currents collected by the array of collection electrodes 35 implicitly provide the convolution of the image intensity as a function of position with a voltage adjustable kernel given by the radiation detection zone or region. User defined modification of the kernel (by appropriate modification of the voltage bias to the gate electrode 31) permits one to quickly change the image convolution being performed, allowing one to switch between image compression, edge enhancement, or other image desired image enhancement techniques. In addition, and in contrast to more conventional fixed geometry light detectors having sharply terminating detection zones, the radiation sensitive region falls smoothly to zero, advantageously eliminating high spatial frequency lobes of an abruptly patterned detector. Furthermore, the combined response of the sensor elements result in nearly a 100% fill factor, maximizing detector response.

Time dependent characteristics of sensor array 29 provide an alternative opportunity for image manipulation. Generated voltage in response to incident light spreads from its point of generation according to a Gaussian distribution function of width $(t/RC)^{1/2}$, where t is the time elapsed from generation, R is the previously defined lateral sheet resistance of the intrinsic layer 36, and C is the capacitance per unit area of the sensor array 29. Therefore, a convolution of the image with varying width Gaussian kernels can be obtained at the points determined by the collection electrodes 35. The image is flashed onto the sensor array while the voltage on the sampling electrodes is measured time. For each sampling time the data represent a convolution of the image with a particular sized kernel. Variation of the bias applied to the gate 31 will also vary the kernel convolved with the image.

Alternatively, the current through the sampling electrodes terminated with a low impedance can be measured and related to a convolution of the image. This second method results in a destructive readout of the image charge, so the image charge must be regenerated if multiple convolutions are to be obtained. In all cases, once the desired convolutions have been obtained, the image charge can be discharged by shorting the collection electrodes 35 to ground.

Figure 8:
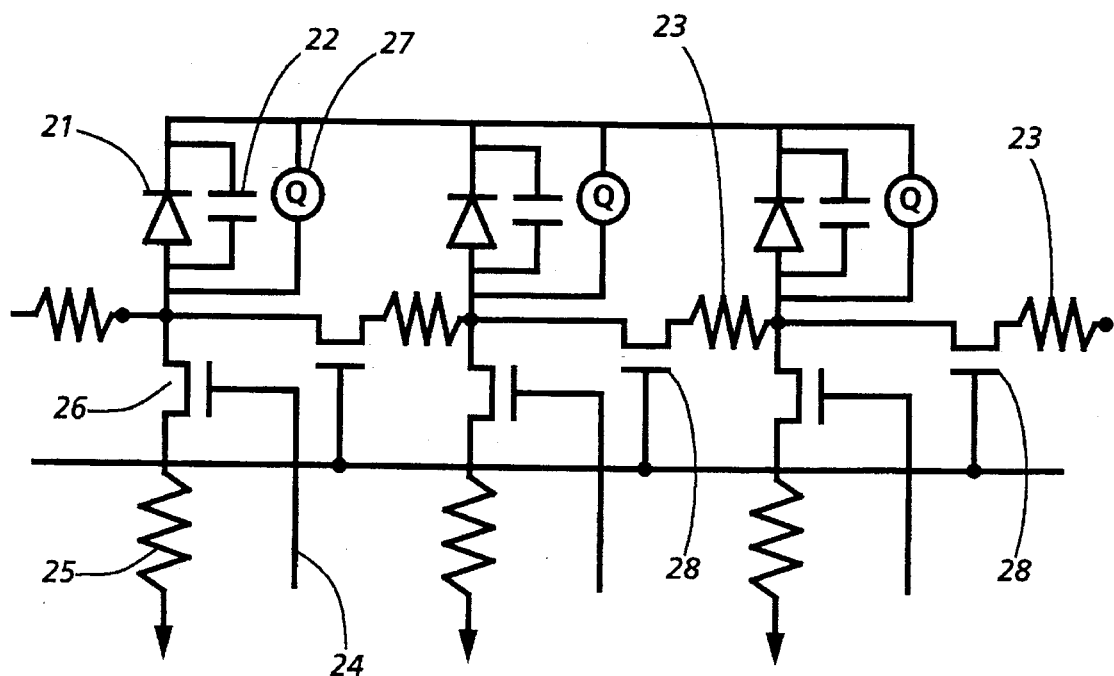
FIG. 8 is an electrical schematic illustrating an equivalent circuit of a sensor array in accordance with the present invention.

To better understand operation of sensor array 29, an equivalent circuit to the sensor array 29 of FIGS. 5 and 6 is shown in FIG. 8. The equivalent circuit includes a diode 21, a capacitor 22 of value C, and a charge source 27 proportional to the light flux integrated from the last sensor discharge. The charge builds up on the capacitor 22. The sensor is readout by selecting the gate 24 of the appropriate pass transistor 26. This dumps the charge out through a resistor 25, which represents the on-resistance of the transistor and/or the termination impedance G of the collection electrodes. The charge goes to the readout electronics (not shown). The various isolated sensor elements are coupled to neighboring sensor elements by electron accumulation in active layer 33, represented by the ideal transistor 28 and a resistor 23. The capacitor 22 has the value C approximately equal to the capacitance per unit area of the sensor. When the charge builds up on a particular sensor element, it partially flows to the neighboring devices through the transistor 28 and resistor 23. If the bias applied to the gate of 28 is small and the conductance 25 is large, the resistance 23 is large and little charge flows to neighboring sensor elements in the sensor array 29. However, a large bias applied to the gate of 28 or a small conductance 25 (high resistance) results in significant charge sharing between sensor elements.

Figure 9:
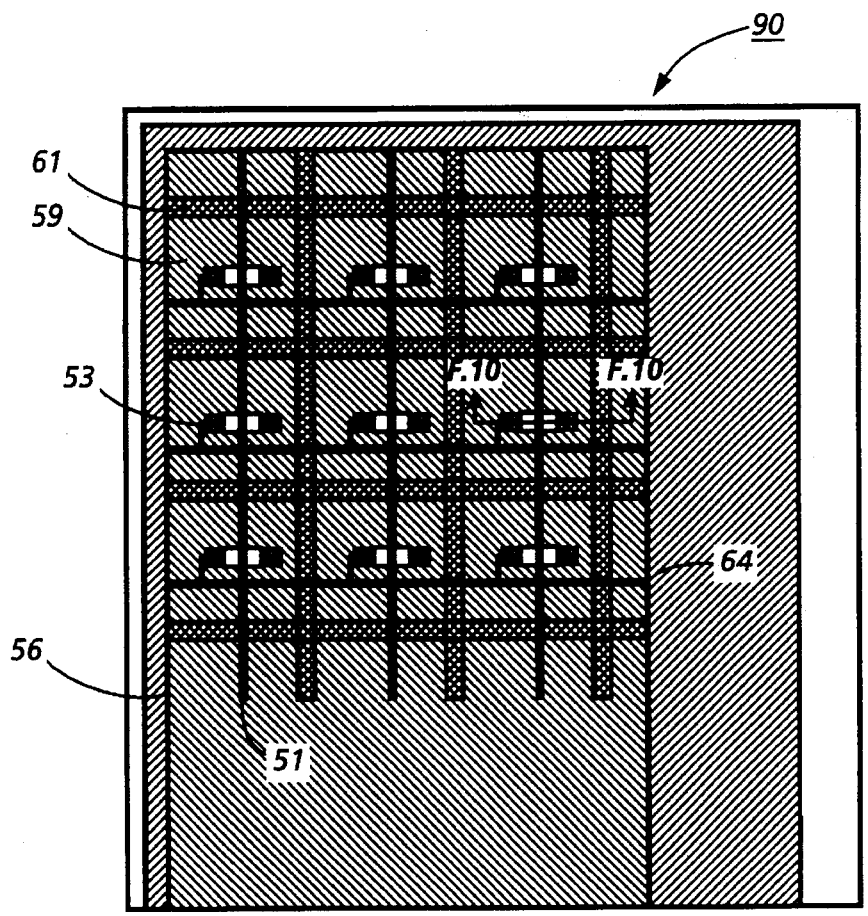
FIG. 9 is another embodiment of a two dimensional radiation sensor array in accordance with the present invention, with the illustrated embodiment having a pass transistor positioned below the sensor layer.
Figure 10:
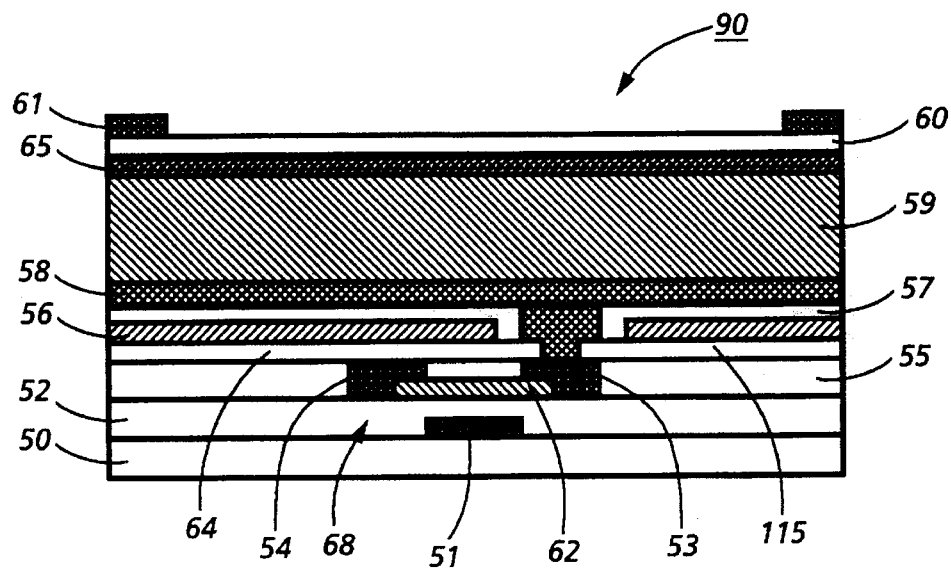
FIG. 10 is a cross sectional view along line 10—10 of FIG. 9.

FIGS. 9 and 10 illustrate a two dimensional sensor array 90 having variable size radiation sensor detection zones in accordance with the present invention. As best seen in cross section in FIG. 10, array 90 includes a field effect pass transistor 68 deposited on a substrate 50. The pass transistor is composed of a gate 51, a drain 53, a source 54, and a channel layer 62 that electrically connects the drain 53 and source 54 when the gate 51 generates a suitable electric field. The drain 53 and source 54 are fashioned from conductive materials such as n+amorphous silicon (e.g., phosphorus doped) or chromium, while the channel layer 62 is constructed from an intrinsic semiconductor such as amorphous silicon. The gate 51 of the pass transistor 68 is separated from the drain 53 and source 54 by a suitable dielectric layer 52 (e.g., silicon nitride).

The pass transistor 68 is covered with a dielectric 115, a gate layer 56 such as titanium/tungsten, and a dielectric silicon oxynitride layer 57. Access to drain 53 through the layers 57, 56, and 115 is maintained with a via, into which an n-type layer 58 (fabricated e.g., from n+amorphous silicon) is deposited. As is apparent from the Figure, this n-type layer 58 is also additionally deposited over layer 57. Atop this layer 58 are sequentially deposited a layer 59 consisting of intrinsic amorphous silicon and a p-type layer 65. A transparent conductive layer layer 60 such as indium tin oxide is deposited over this p-type layer 65, and a conducting metal grid is positioned in electrical contact with the transparent conductive layer 60. The metal grid 61 can be arranged as a light shield.

The response of array 90 to incident radiation is similar to the previously described sensor array 29 of FIGS. 5 and 6. The metal grid 61 is reverse biased so that layers 65, 59, and 58 together form a p-i-n detector. Illumination of sensor array 90 with incident radiation causes formation of electrons and holes in the intrinsic layer 59. Electrons drift toward the layer 58 and remain there until pass transistor 68 is activated to sample stored charge by transferring the charge along data lines 64, best seen in FIG. 9, which are connected to source 54 of transistor 68.

Figure 11:
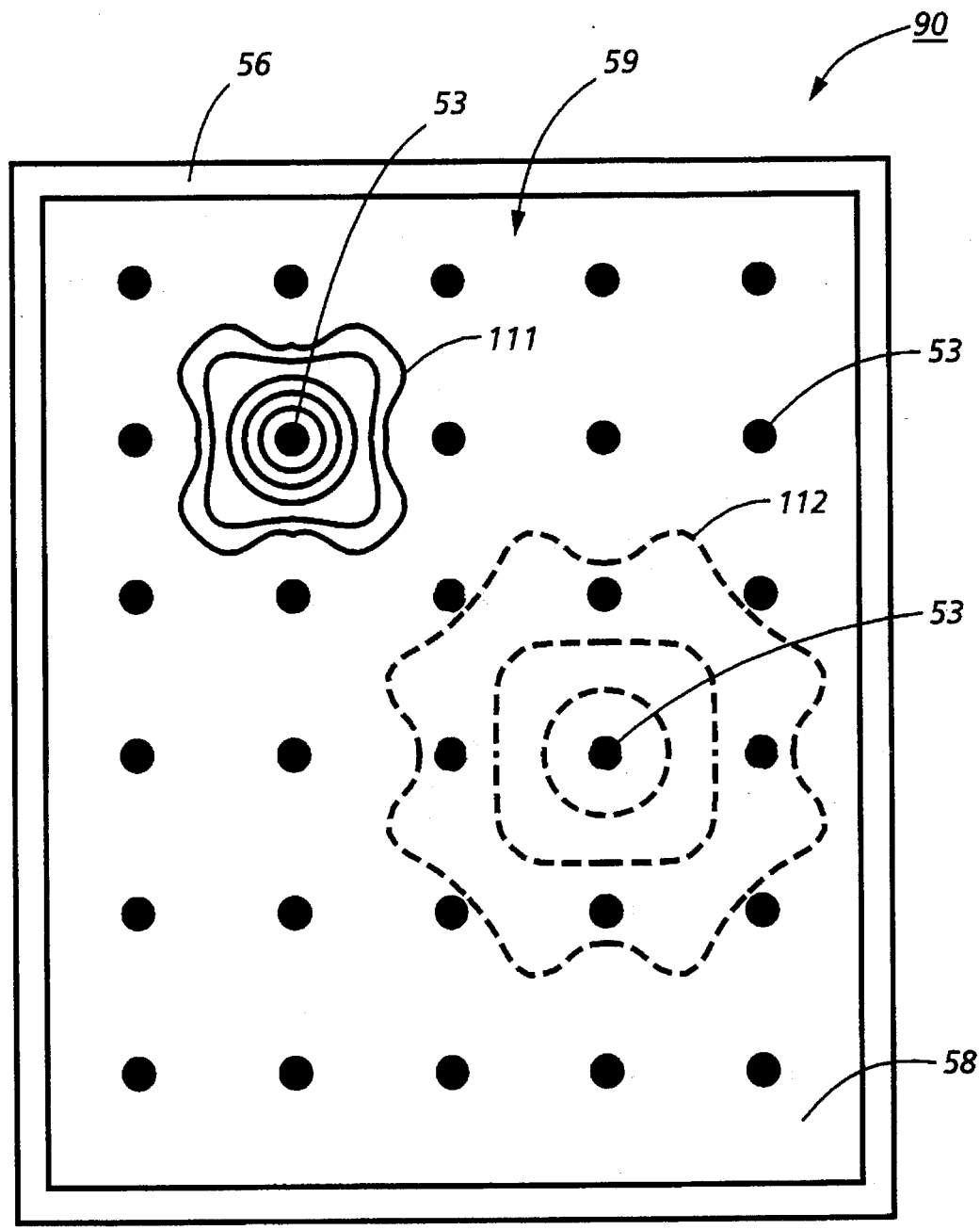
FIG. 11 is a schematic view of the sensor array of FIGS. 9 and 10, expanded to illustrate 30 sensing centers in a two dimensional array.

The electrical response of collection electrode 58 of sensor array 90 to incident radiation is qualitatively indicated in FIG. 11. For small positive voltage biases applied to the gate 56, the lateral sheet resistance R of layer 58 is large. In this case and/or if the pass transistors 68 are terminated with high conductances, the isocurrent sensor response to a spatially scanned point source is indicated by solid lines 111 in FIG. 11. When a large positive voltage bias is applied to the sensor gate electrode 56, the sensor 90 light responsive pattern respectively centered on each drain 53 increases significantly to overlap neighboring sensor sites as shown in dotted lines 112 in FIG. 11.

Figure 12:
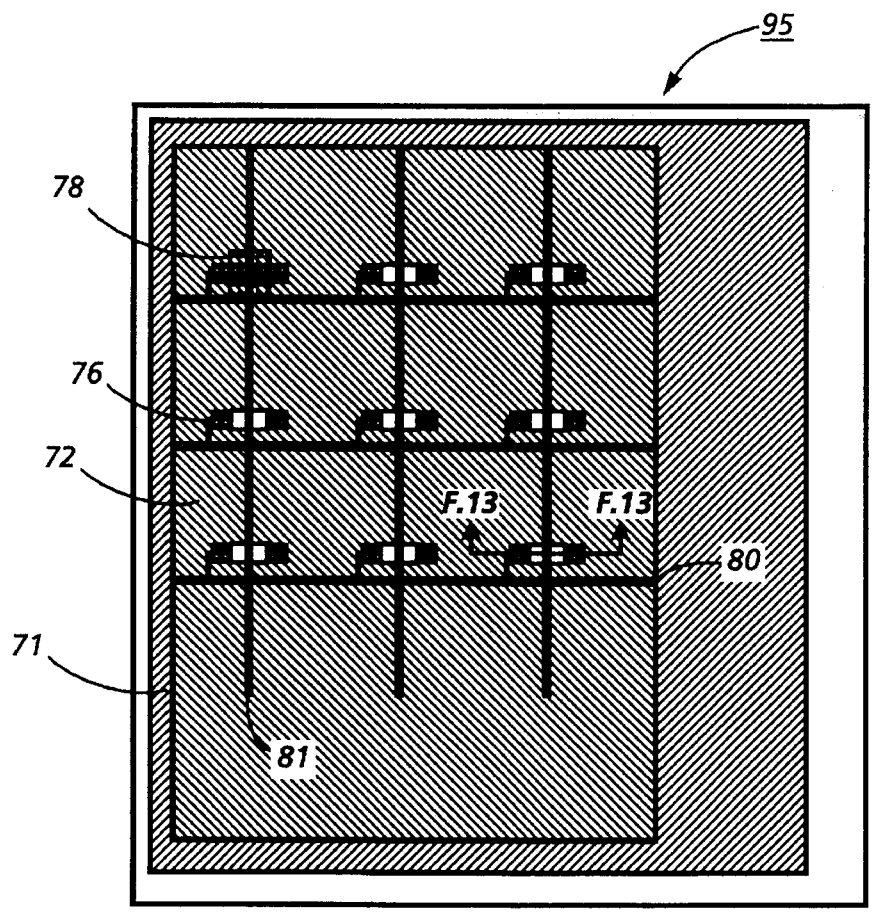
FIG. 12 is another embodiment of a two dimensional sensor array in accordance with the present invention, with the illustrated embodiment having a pass transistor positioned above the sensor layer.
Figure 13:
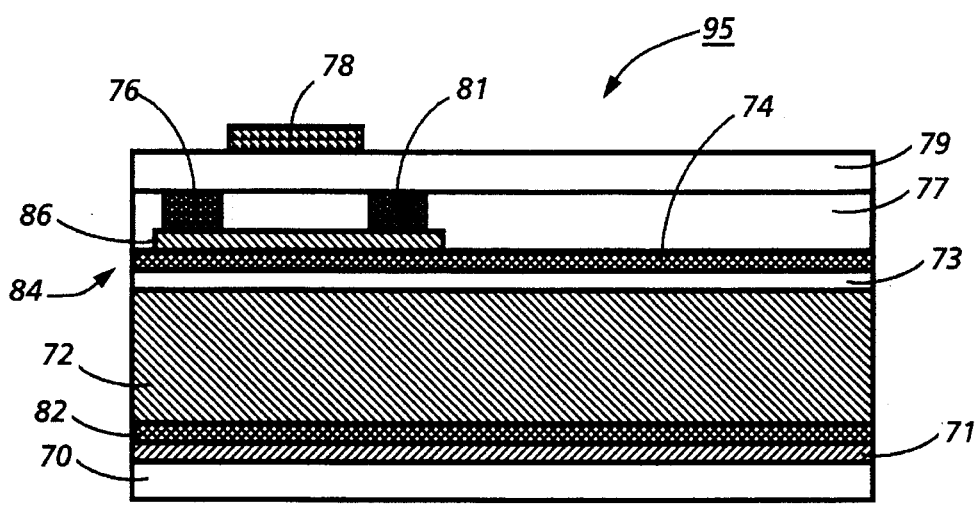
FIG. 13 is a cross sectional view along line 13—13 of FIG. 12.

In contrast to previously discussed embodiments of the present invention, the embodiment illustrated in FIGS. 12 and 13 is a two-dimensional variable sensor array 95 having pass transistors 84 positioned on top of the sensor array, rather than adjacent to the substrate. As best seen with reference to FIG. 13, the n-type amorphous silicon layer 73 acts as a collection electrode, with data readout accomplished by transfer of charge from drain 81 to source 76 through a semiconductive channel 86. The source 76 and drain 81 are made from n+amorphous silicon/chromium layers, and channel 86 is made from a semiconductive material. The n-type layer gate 73 is separated from the drain 81, channel 86, and source 76 by a dielectric layer 74. Positioned beneath gate 73 of pass transistor 84 is respectively an intrinsic semiconductor layer 72, a p-type semiconductor layer 82, an optional transparent electrode material 71 such as cermet, (if the resistance of the p-type layer 82 is low, material 71 is not usually required), and a substrate 70. For physical protection, the sensor array 95 is covered with an additional dielectric layer 79. In addition, a patterned light shield 78 can be employed to limit incident radiation upon the pass transistor 84.

In operation, radiation directed to pass through transparent dielectric layer 79 generates charges in the intrinsic semiconductor layer 72. A positive bias applied to the pass transistor gate 73 attracts electrons generated in layer 72 to the active layer gate 73. Those electrons in the active layer gate 73 near the channel layer 86 alter the current passing between the source 76 and drain 81, with the resultant current related to the number of generated electrons in gate 73. When charge measurement is completed, the radiation generated charge is removed by forward biasing the diode to dump the generated charge in preparation for a new exposure to incident radiation. As those skilled in the art will appreciate, one cannot remove the previous charge by grounding the collection electrodes as in the embodiment discussed with reference to FIGS. 9 and 10. Of all the discussed embodiments of the present invention, the embodiment represented by sensor 95 results in the smallest perturbation on the charge spreading in the sensor layer, and permits the possibility of gain to be incorporated in the sensing process. Consequently, the potential sensitivity of this embodiment may exceed that of the previous embodiments.

While the present invention has been described in conjunction with specific embodiments thereof, it is evident that many alternatives, modifications, and variations will be apparent to those skilled in the art. Accordingly, the various embodiments described herein should be considered illustrative, and not limiting the scope of the present invention as defined in the following claims.

What is claimed is:

1. A sensor element comprising a collection electrode, a radiation sensor in contact with the collection electrode, the radiation sensor configured to produce a detectable response at the collection electrode upon incidence of radiation in a responsive zone, and a gate electrode layer separated from the radiation sensor by a dielectric layer, with adjustments to voltage applied to the gate electrode layer inducing changes in areal extent of the responsive zone of the radiation sensor.

2. The sensor element of claim 1, wherein the radiation sensor is a layered semiconductor further comprising an n+doped layer and a p+doped layer.

3. The sensor element of claim 2, wherein the layered semiconductor of the radiation sensor further comprises an intrinsic amorphous silicon layer positioned between the n+doped layer and the p+doped layer to form a p-i-n diode.

4. The sensor element of claim 1, further comprising a data line and a pass transistor connected to receive charge from the collection electrode for controlled passing of charge to the data line.

5. The sensor element of claim 4, wherein the pass transistor has a drain connected to the collection electrode, a source connected to the data line and separated from the drain, and a pass transistor gate electrode controllable to promote passage of charge from the drain to the source.

6. The sensor element of claim 4, wherein the collection electrode is a pass transistor gate electrode in electrical contact with the radiation sensor, the pass transistor gate electrode being responsive to photogenerated charge from the radiation sensor to control current passing between a drain and a source.

7. A sensor element array comprising a plurality of collection electrodes, a radiation sensor in electrical contact with the collection electrodes, the radiation sensor configured to produce a detectable response at each of the collection electrodes upon incidence of radiation in a responsive zone associated with each of the respective collection electrodes, and a gate electrode separated from the radiation sensor by a dielectric layer, with adjustments to voltage applied to the gate electrode inducing changes in areal extent of the respective responsive zones associated with each of the collection electrodes in electrical contact with the radiation sensor layer.

8. The sensor element of claim 7, wherein the radiation sensor further comprises a continuously extending semiconductive layer that generates charge in response to incident radiation.

9. A sensor element comprising a radiation sensitive layer configured to produce a detectable response upon incidence of radiation in a responsive zone, and a semiconductor layer positioned adjacent to the radiation sensitive layer and arranged to induce changes in areal extent of the responsive zone of the radiation sensitive layer in response to change in voltage bias applied to the semiconductor layer.

10. The sensor element of claim 9, further comprising a dielectric layer positioned between the radiation sensitive layer and the semiconductor layer.

11. The sensor element of claim 9, further comprising a plurality of collection electrodes in electrical contact with the radiation sensitive layer.

* * * * *